US012041860B2

(12) United States Patent
Chih et al.

(10) Patent No.: US 12,041,860 B2
(45) Date of Patent: Jul. 16, 2024

(54) RESISTIVE MEMORY DEVICE AND METHOD FOR MANUFACTURING WITH PROTRUSION OF ELECTRODE

(71) Applicant: TAIWAN SEMICONDUCTOR MANUFACTURING COMPANY, LTD., Hsinchu (TW)

(72) Inventors: Yu-Der Chih, Hsinchu (TW); Wen-Zhang Lin, Hsinchu (TW); Yun-Sheng Chen, Hsinchu (TW); Jonathan Tsung-Yung Chang, Hsinchu (TW); Chrong-Jung Lin, Hsinchu (TW); Ya-Chin King, Hsinchu (TW); Cheng-Jun Lin, Hsinchu (TW); Wang-Yi Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 162 days.

(21) Appl. No.: 17/581,153

(22) Filed: Jan. 21, 2022

(65) Prior Publication Data
US 2023/0240156 A1  Jul. 27, 2023

(51) Int. Cl.
*H10N 70/00* (2023.01)
*H10B 63/00* (2023.01)

(52) U.S. Cl.
CPC .......... *H10N 70/021* (2023.02); *H10B 63/80* (2023.02); *H10N 70/063* (2023.02); *H10N 70/066* (2023.02); *H10N 70/068* (2023.02); *H10N 70/841* (2023.02)

(58) Field of Classification Search
CPC .. H10N 70/021; H10N 70/063; H10N 70/068; H10N 70/841; H10N 70/8265; H10N 70/883; H10N 70/884; H10N 70/066; H10N 70/20; H10B 63/30; H10B 63/82; H10B 63/80
See application file for complete search history.

(56) References Cited

U.S. PATENT DOCUMENTS 9,853,215 B1 * 12/2017 Tseng .................. H10N 70/826
2008/0019167 A1 * 1/2008 Doan ..................... H10B 63/80
257/3

FOREIGN PATENT DOCUMENTS

CN          105529399 B  * 10/2017  ............. H01L 45/04

OTHER PUBLICATIONS

A Resistance-change Memory Based On Multi-element Metal Oxide Thin Film And Preparation Method Thereof; Wei Min (Year: 2016).*

* cited by examiner

*Primary Examiner* — Sultana Begum
(74) *Attorney, Agent, or Firm* — Birch, Stewart, Kolasch & Birch, LLP

(57) ABSTRACT

A resistive memory device includes a bottom electrode, a top electrode and a resistance changing element. The top electrode is disposed above and spaced apart from the bottom electrode, and has a downward protrusion aligned with the bottom electrode. The resistance changing element covers side and bottom surfaces of the downward protrusion.

20 Claims, 21 Drawing Sheets

RESISTIVE MEMORY DEVICE AND METHOD FOR MANUFACTURING WITH PROTRUSION OF ELECTRODE

BACKGROUND

A resistive memory device is a type of non-volatile memory device, and each memory cell thereof can be switched between a low resistance state and a high resistance state to store data. A conventional resistive memory device can be manufactured using a complementary metal oxide semiconductor (CMOS) logic process, but is fabricated in the front-end-of-line (FEOL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 to 8 are schematic sectional views and FIGS. 9 to 13 are schematic perspective views.

DETAILED DESCRIPTION

Figure 1:
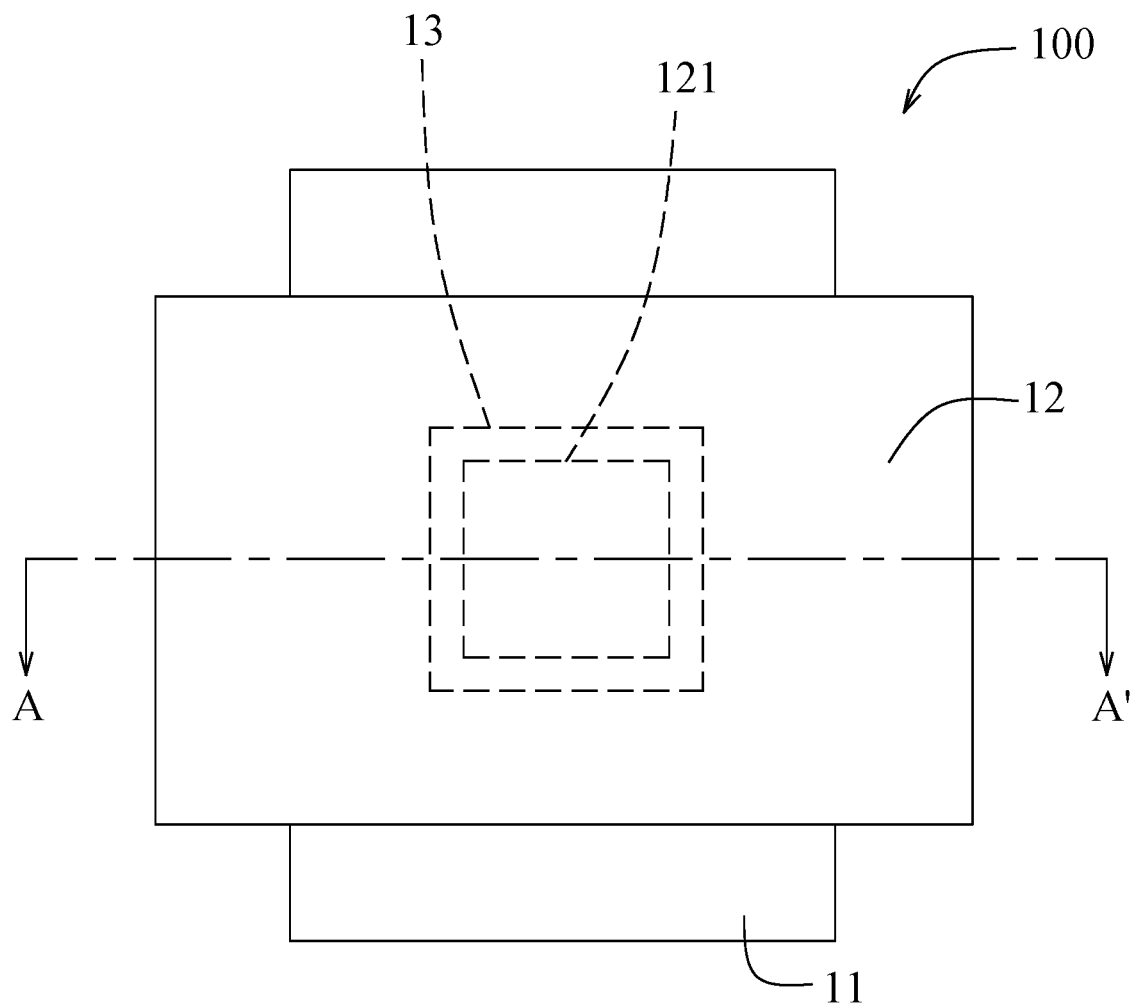
FIG. 1 is a schematic top view of a memory cell of a resistive memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Figure 2:
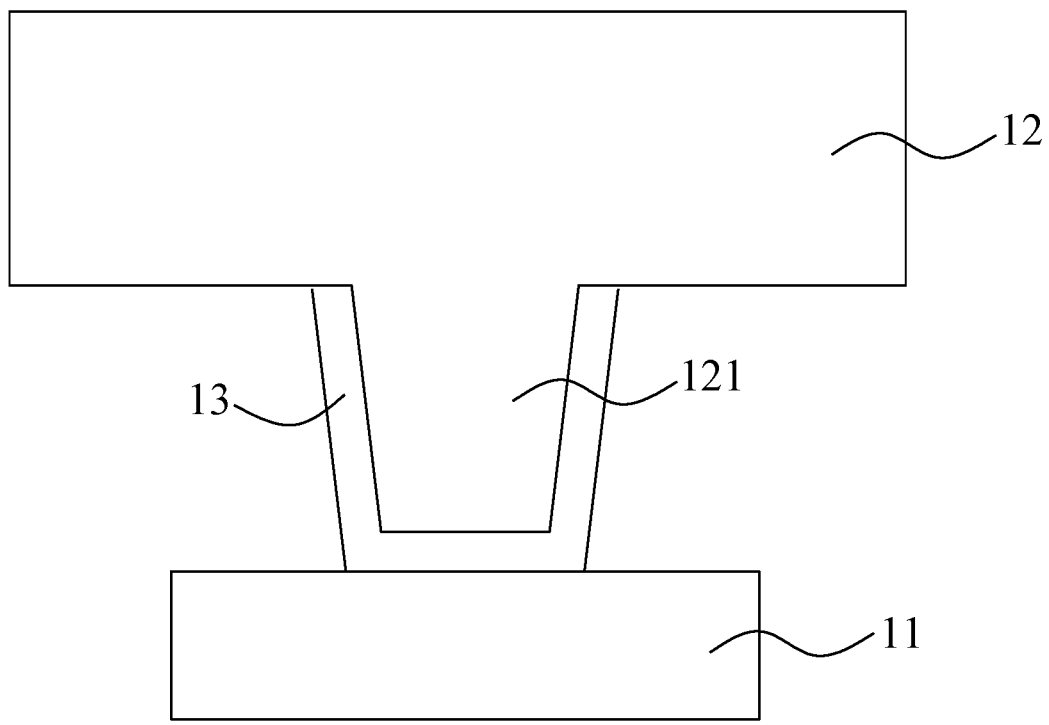
FIG. 2 is a schematic sectional view of the memory cell taken along line A-A' of FIG. 1 in accordance with some embodiments.

FIG. 1 is a schematic top view of a memory cell 100 of a resistive memory device in accordance with some embodiments. FIG. 2 is a schematic sectional view of the memory cell 100 taken along line A-A' of FIG. 1 in accordance with some embodiments. The memory cell 100 includes a bottom electrode 11, a top electrode 12 and a resistance changing element 13. The top electrode 12 is disposed above and spaced apart from the bottom electrode 11, and has a downward protrusion 121 that is aligned with the bottom electrode 11. The resistance changing element 13 covers side and bottom surfaces of the downward protrusion 121. The resistance changing element 13 provides a storage node between the top electrode 12 and the bottom electrode 11, so the memory cell 100 can store one bit of data.

In some embodiments, the downward protrusion 121 may taper from top to bottom. In some embodiments, a top cross section of the downward protrusion 121 may be a rectangle that has a predetermined aspect ratio falling within a range of from about 1:10 to about 10:1. If the predetermined aspect ratio is outside this range, the top cross section of the downward protrusion 121 would have a very large area, which is adverse to miniaturization of the memory cell 100. In some embodiments, each side length of a bottom cross section of the downward protrusion 121 may be smaller than a corresponding side length of the top cross section of the downward protrusion 121 by a predetermined scaling factor that falls within a range of from about 5% to about 50% (i.e., each side length of the bottom cross section of the downward protrusion 121 may be about 95% to 50% of the corresponding side length of the top cross section of the downward protrusion 121). If the predetermined scaling factor is smaller than 5%, it would be very difficult to manufacture the memory cell 100. If the predetermined scaling factor is greater than 50%, the bottom cross section of the downward protrusion 121 would have a very small area, and the memory cell 100 would be unable to operate properly.

In some embodiments, a distance between the downward protrusion 121 and the bottom electrode 11 may fall within a range of from about 1 nm to about 15 nm. If the distance is smaller than 1 nm, the resistance changing element 13 would be very thin, and the memory cell 100 would have a poor resistance changing effect. If the distance is greater than 15 nm, the resistance changing element 13 would be very thick, and it would be necessary to write data to and read data from the memory cell 100 at high voltages.

In some embodiments, the resistance changing element 13 may be made of a material containing metal atoms and oxygen atoms (for example but not limited to metal oxide, metal oxycarbide, metal oxynitride, metal oxycarbonitride, or combinations thereof). In some embodiments, an atomic percent of the oxygen atoms in the resistance changing element 13 may fall within a range of from about 10% to about 90%. If the atomic percent of the oxygen atoms is smaller than 10%, the resistance changing element 13 would not have a high resistance state, and the memory cell 100 would not have a resistance changing effect. It would be difficult to make the atomic percent of the oxygen atoms greater than 90% if the resistance changing element 13 is generated by chemical reaction.

Figure 3:
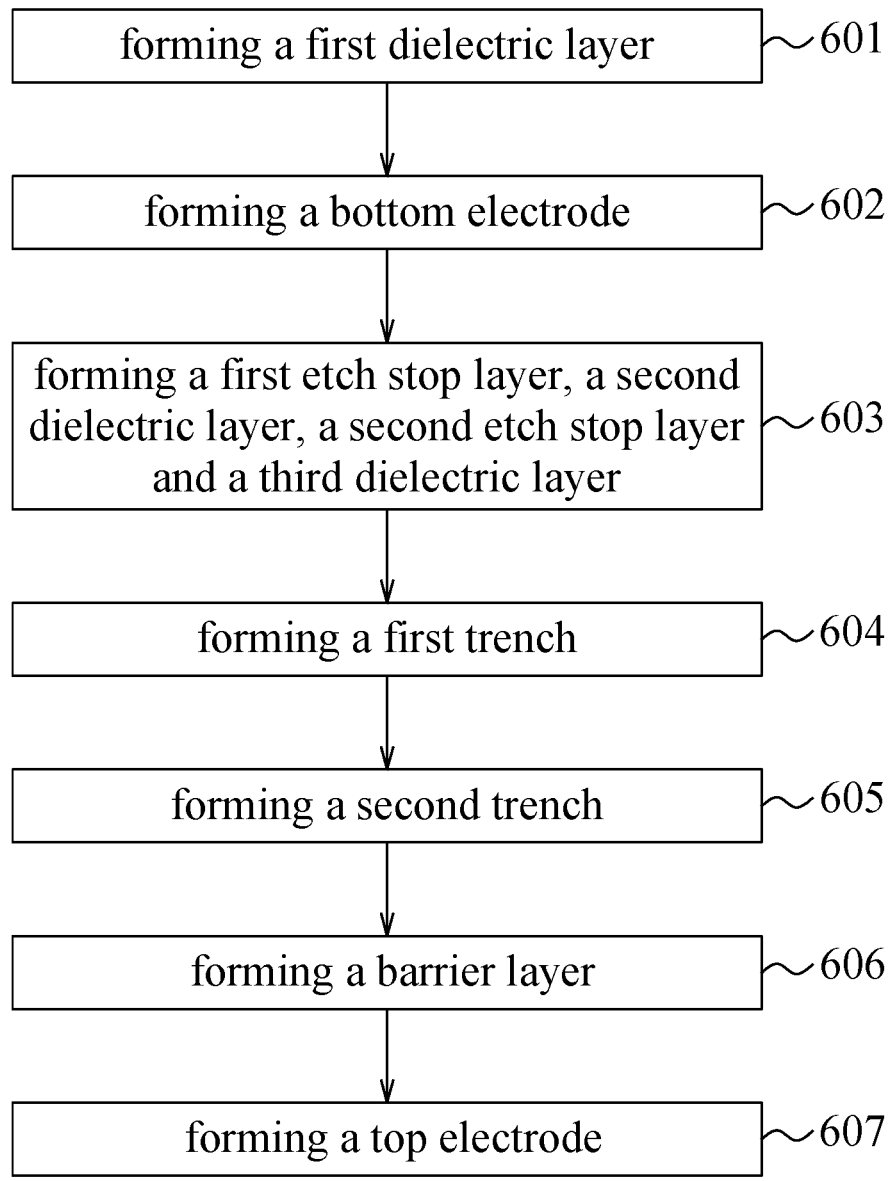
FIG. 3 is a flow chart illustrating a method for manufacturing a memory cell of a resistive memory device in accordance with some embodiments.

FIG. 3 is a flow chart illustrating a method 600 for manufacturing a memory cell of a resistive memory device in accordance with some embodiments. FIGS. 4 to 13 are schematic sectional views of semiconductor structures 700 during various stages of the method 600. The method 600 and the semiconductor devices 700 are collectively described below. However, additional steps can be provided before, after or during the method 600, and some of the steps described herein may be replaced by other steps or be eliminated. Similarly, further additional features may be present in the semiconductor devices 700, and/or features present may be replaced or eliminated in additional embodiments.

Figure 4:
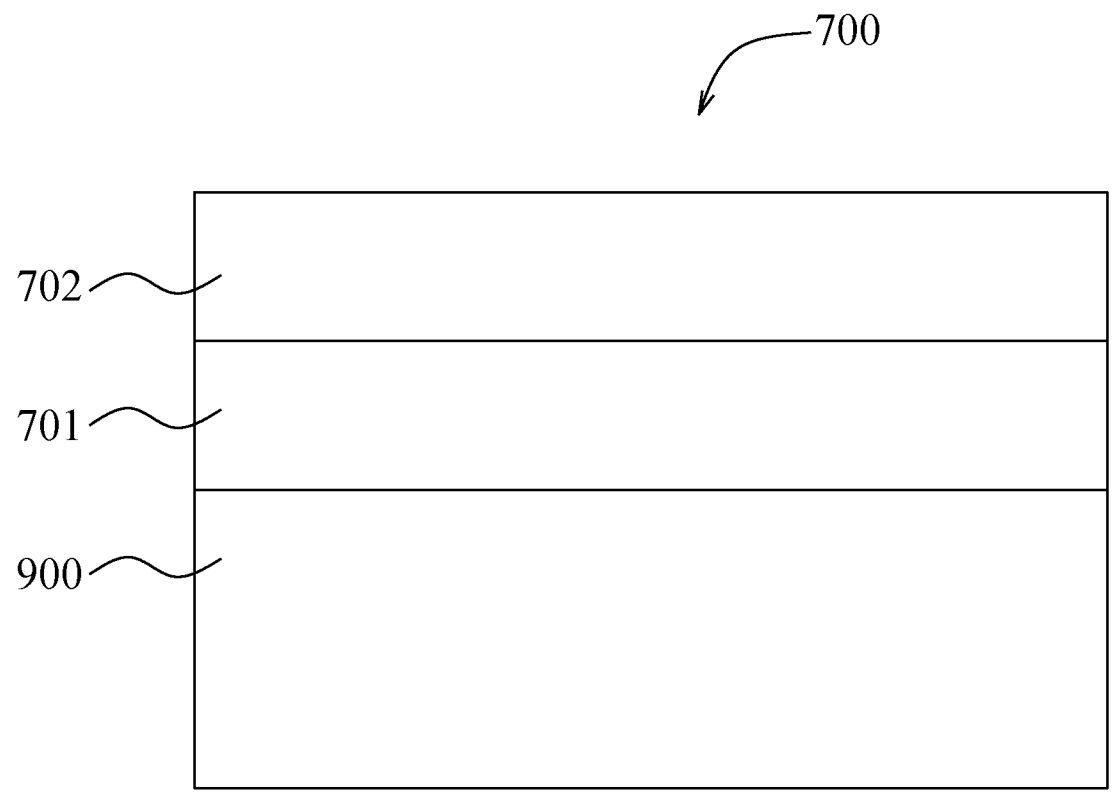
FIGS. 4 to 13 illustrate intermediate stages of the method for manufacturing a memory cell of a resistive memory device according to some embodiments, where

Referring to FIGS. 3 and 4, the method 600 begins at block 601, where a first dielectric layer 701 is formed on a substrate 900. In some embodiments, the first dielectric layer 701 may be formed on the substrate 900 using, for example, physical vapor deposition (PVD), chemical vapor deposition (CVD), atomic layer deposition (ALD), electroless plating, electroplating, other suitable deposition techniques, or combinations thereof. In some embodiments, the substrate 900 may be a silicon substrate that is formed with a plurality of transistors used to write data to and read data from a resistive memory device. In some embodiments, the first dielectric layer 701 may be made of silicon oxide, silicon carbide, silicon nitride, silicon oxycarbide, silicon oxynitride, silicon carbonitride, silicon oxycarbonitride, undoped silicate glass (USG), phosphosilicate glass (PSG), borosilicate glass (BSG), boron-doped phosphosilicate glass (BPSG), fluorine-doped silicate glass (FSG), other suitable dielectric materials, or combinations thereof. In alternative embodiments, the first dielectric layer 701 may be made of polyimide, epoxy resin, acrylic resin, phenol resin, benzocyclobutene (BCB), polybenzooxazole (PBO), other suitable polymer-based dielectric materials, or combinations thereof. Other suitable materials for the first dielectric layer 701 are within the contemplated scope of the present disclosure.

Figure 5:
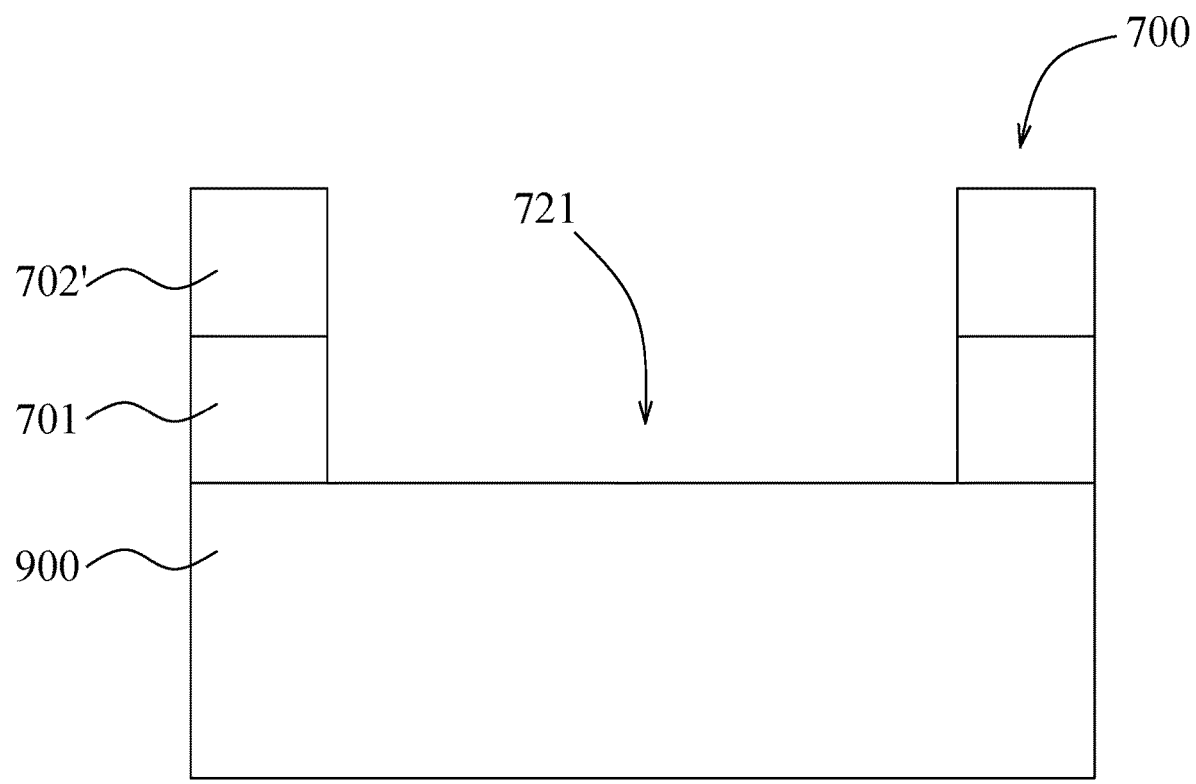
Figure 6:
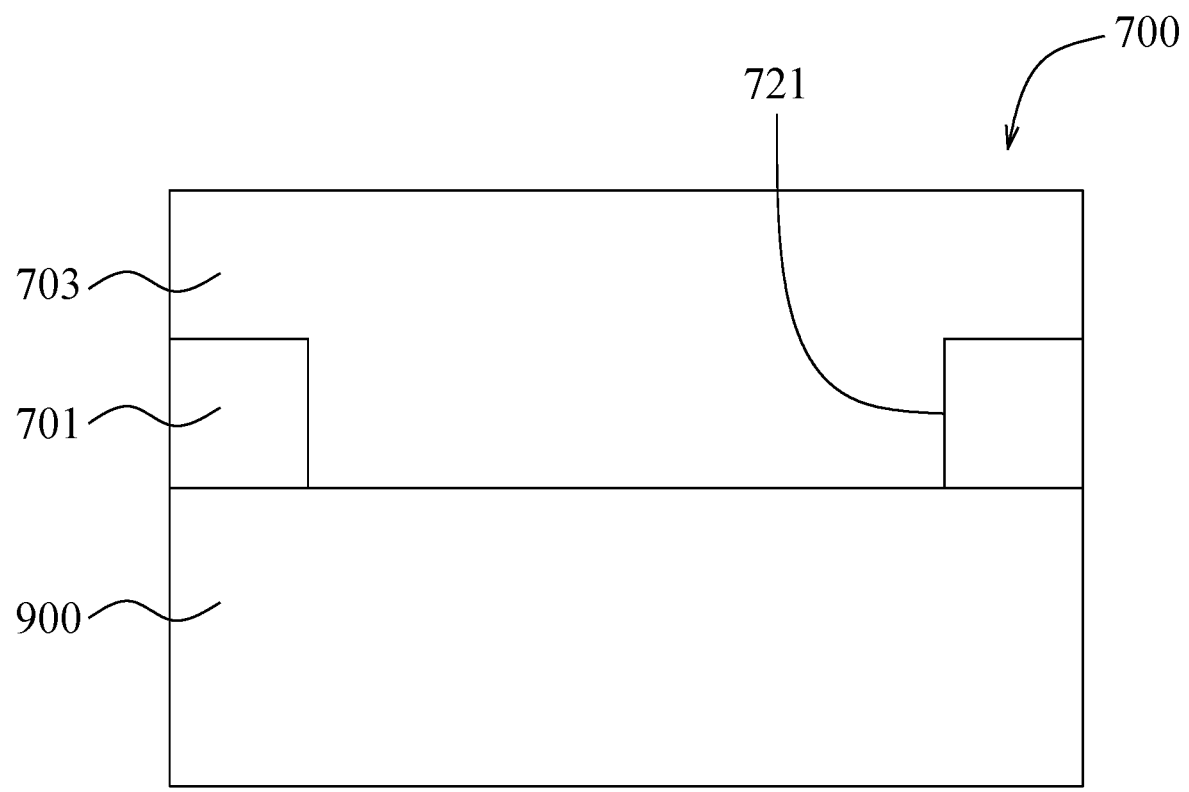
Figure 7:
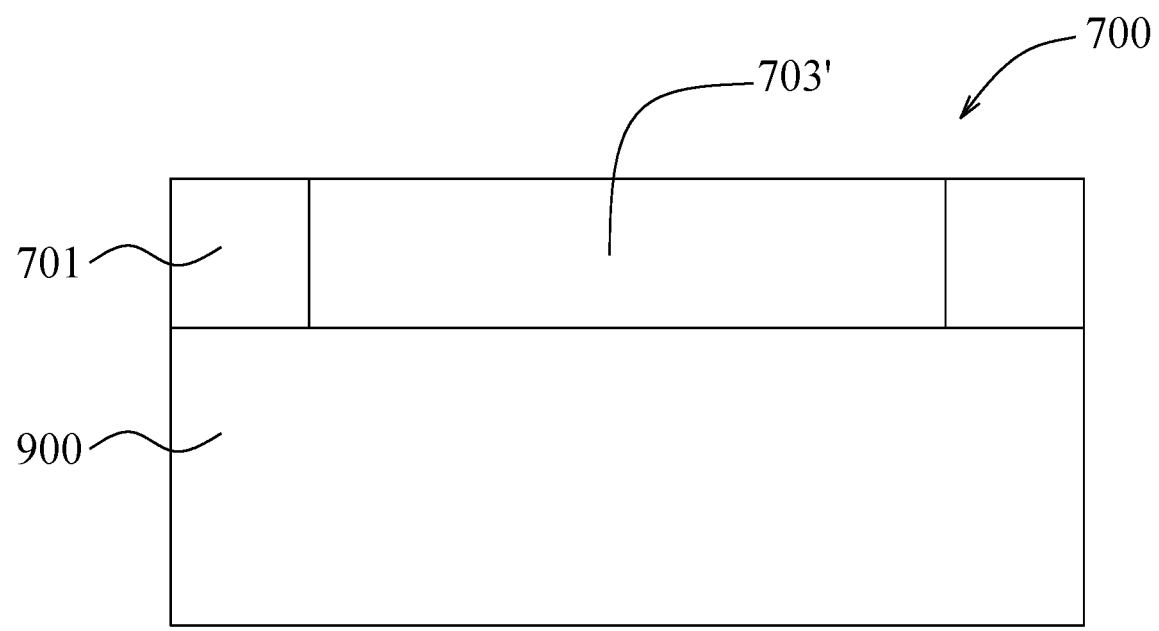

Referring to FIGS. 3, 4, 5, 6 and 7, the method 600 then proceeds to block 602, where a bottom electrode 703' is formed in the first dielectric layer 701. Block 602 may be implemented as described below. Firstly, as shown in FIGS. 4 and 5, a photolithography process, which includes, for example, but not limited to, coating the first dielectric layer 701 with a photoresist 702, soft-baking, exposing the photoresist 702 through a photomask (not shown), post-exposure baking, developing the photoresist 702, and hard-baking, may be used to form a patterned photoresist 702'. Secondly, as shown in FIG. 5, the first dielectric layer 701 may be etched through the patterned photoresist 702' using, for example, dry etching, wet etching, other suitable etching techniques, or combinations thereof, so as to form a recess 721. The patterned photoresist 702' may be removed after the etching process. Thirdly, as shown in FIG. 6, a conductive material 703 may be deposited on the first dielectric layer 701 using, for example, physical vapor deposition, chemical vapor deposition, atomic layer deposition, electroless plating, electroplating, other suitable deposition techniques, or combinations thereof, so as to fill the recess 721. Fourthly, as shown in FIGS. 6 and 7, an excess portion of the conductive material 703 on the first dielectric layer 701 may be removed using, for example, chemical mechanical polishing (CMP), or other suitable planarization techniques. The remaining portion of the conductive material 703 is referred to as the bottom electrode 703' that would serve as the bottom electrode 11 of the memory cell 100 shown in FIG. 1. In some embodiments, the bottom electrode 703' may be made of copper, aluminum, tungsten, tantalum, titanium, compounds thereof, other suitable conductive materials, or combinations thereof. Other suitable materials for the bottom electrode 703' are within the contemplated scope of the present disclosure.

Figure 8:
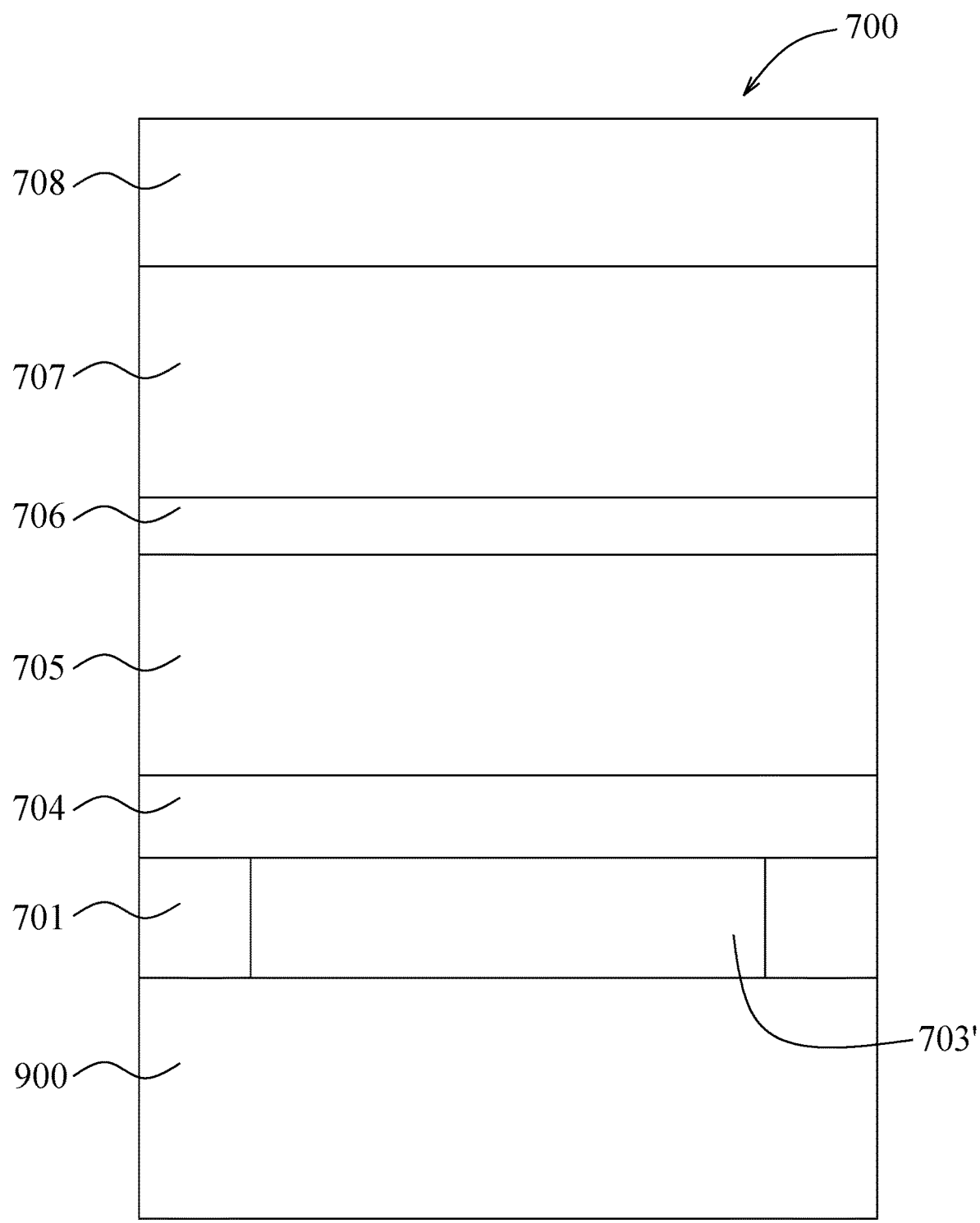

Referring to FIGS. 3 and 8, the method 600 then proceeds to block 603, where a first etch stop layer 704, a second dielectric layer 705, a second etch stop layer 706 and a third dielectric layer 707 are sequentially formed on the first dielectric layer 701 and the bottom electrode 703'. In some embodiments, the first etch stop layer 704, the second dielectric layer 705, the second etch stop layer 706 and the third dielectric layer 707 may be sequentially formed on the first dielectric layer 701 and the bottom electrode 703' using, for example, physical vapor deposition, chemical vapor deposition, atomic layer deposition, electroless plating, electroplating, other suitable deposition techniques, or combinations thereof. In some embodiments, each of the first etch stop layer 704 and the second etch stop layer 706 may be made of metal nitride, metal oxide, metal carbide, silicon nitride, silicon oxide, silicon carbide, silicon oxynitride, or combinations thereof. Other suitable materials for the first etch stop layer 704 and the second etch stop layer 706 are within the contemplated scope of the present disclosure. The first etch stop layer 704 and the second etch stop layer 706 may be made of the same or different materials. In some embodiments, the second dielectric layer 705 may be made of a dielectric material containing oxygen atoms (for example but not limited to silicon oxide, silicon oxycarbide, silicon oxynitride, silicon oxycarbonitride, undoped silicate glass, phosphosilicate glass, borosilicate glass, boron-doped phosphosilicate glass, fluorine-doped silicate glass, or combinations thereof). Other suitable materials for the second dielectric layer 705 are within the contemplated scope of the present disclosure. In some embodiments, the third dielectric layer 707 may be made of silicon oxide, silicon carbide, silicon nitride, silicon oxycarbide, silicon oxynitride, silicon carbonitride, silicon oxycarbonitride, undoped silicate glass, phosphosilicate glass, borosilicate glass, boron-doped phosphosilicate glass, fluorine-doped silicate glass, other suitable dielectric materials, or combinations thereof. In alternative embodiments, the third dielectric layer 707 may be made of polyimide, epoxy resin, acrylic resin, phenol resin, benzocyclobutene, polybenzooxazole, other suitable polymer-based dielectric materials, or combinations thereof. Other suitable materials for the third dielectric layer 707 are within the contemplated scope of the present disclosure. The first dielectric layer 701, the second dielectric layer 705 and the third dielectric layer 707 may be made of the same or different materials.

Figure 9:
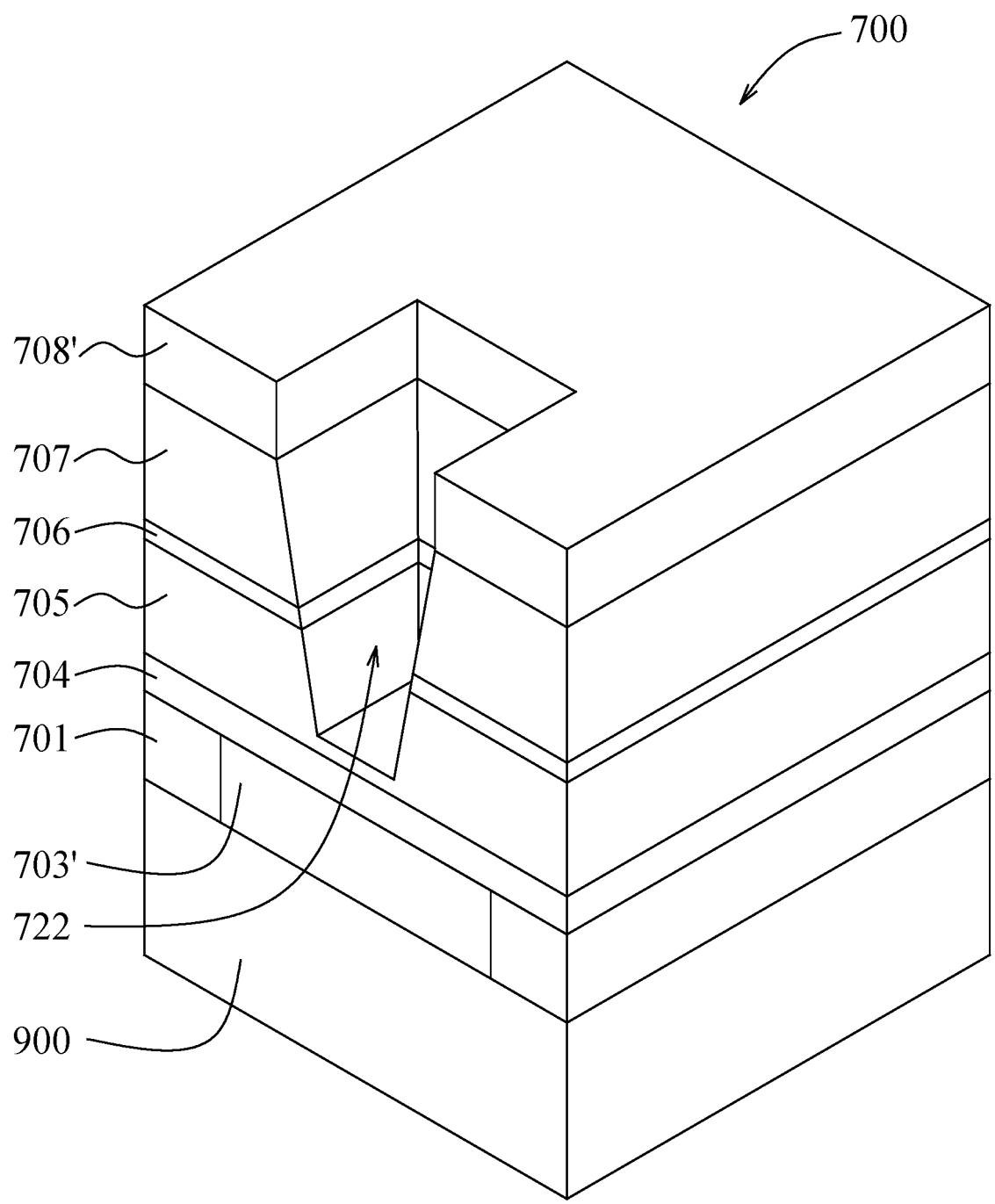

Referring to FIGS. 3, 8 and 9, the method 600 then proceeds to block 604, where the third dielectric 707, the second etch stop layer 706 and the second dielectric layer 705 are recessed to form a first trench 722 in the second dielectric layer 705. The first trench 722 is aligned with the bottom electrode 703', has a top boundary coplanar with a top surface of the second dielectric layer 705, and does not expose the first etch stop layer 704. That is, the first trench 722 has a depth smaller than a thickness of the second dielectric layer 705. Block 604 may be implemented as described below. Firstly, as shown in FIGS. 8 and 9, a photolithography process, which includes, for example, but not limited to, coating the third dielectric layer 707 with a photoresist 708, soft-baking, exposing the photoresist 708 through a photomask (not shown), post-exposure baking, developing the photoresist 708, and hard-baking, may be used to form a patterned photoresist 708'. Secondly, as shown in FIG. 9, the third dielectric layer 707, the second etch stop layer 706 and the second dielectric layer 705 may be etched through the patterned photoresist 708' using, for example, dry etching, wet etching, other suitable etching techniques, or a combination thereof, so as to form the first trench 722 in the second dielectric layer 705. The patterned photoresist 708' may be removed after block 604. In some embodiments, the first trench 722 may taper from top to bottom. In some embodiments, a top cross section of the first trench 722 may be a rectangle that has a predetermined aspect ratio falling within a range of from about 1:10 to about 10:1. In some embodiments, each side length of a bottom cross section of the first trench 722 may be about 50% to 95% of a corresponding side length of the top cross section of the first trench 722.

Figure 10:
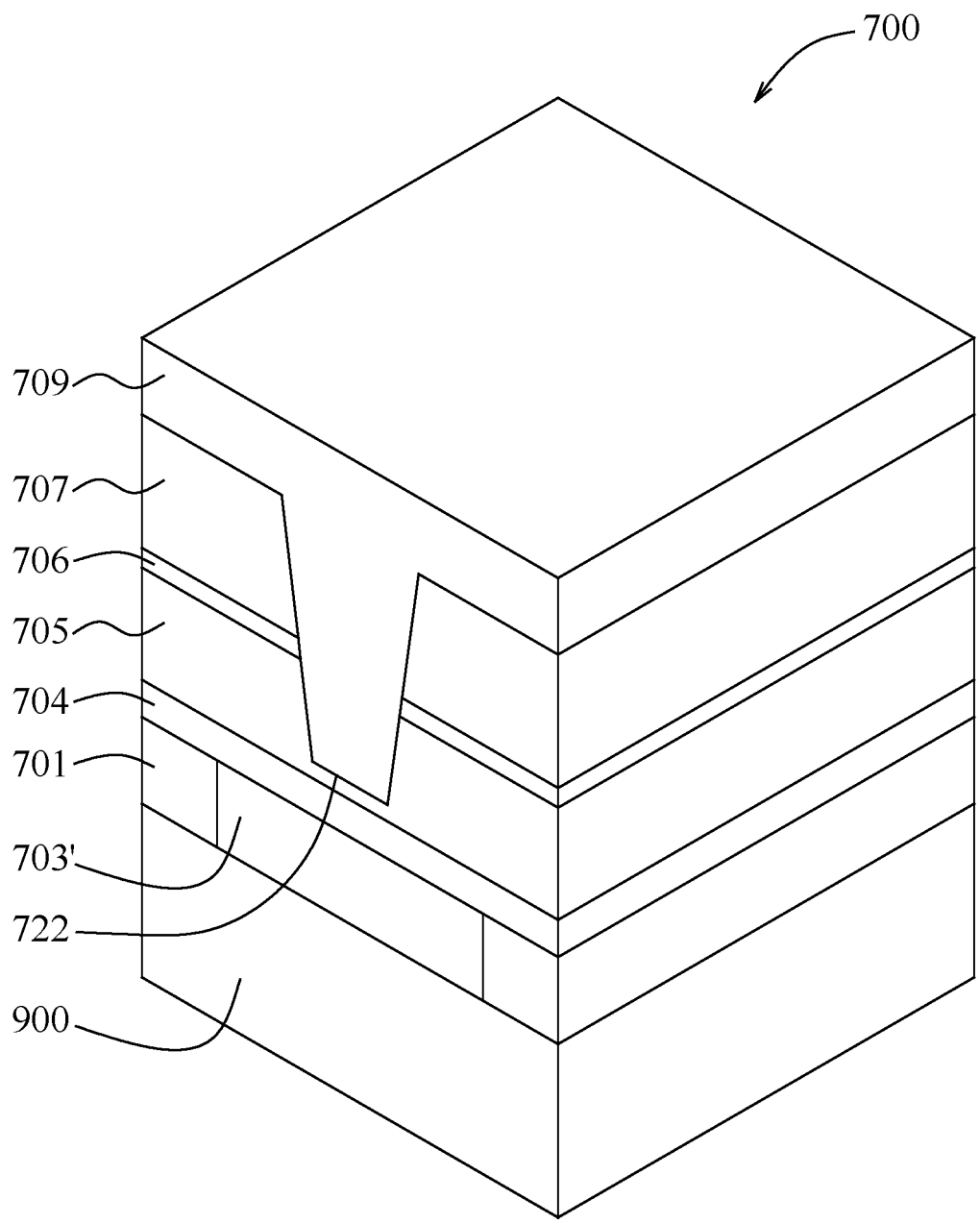
Figure 11:
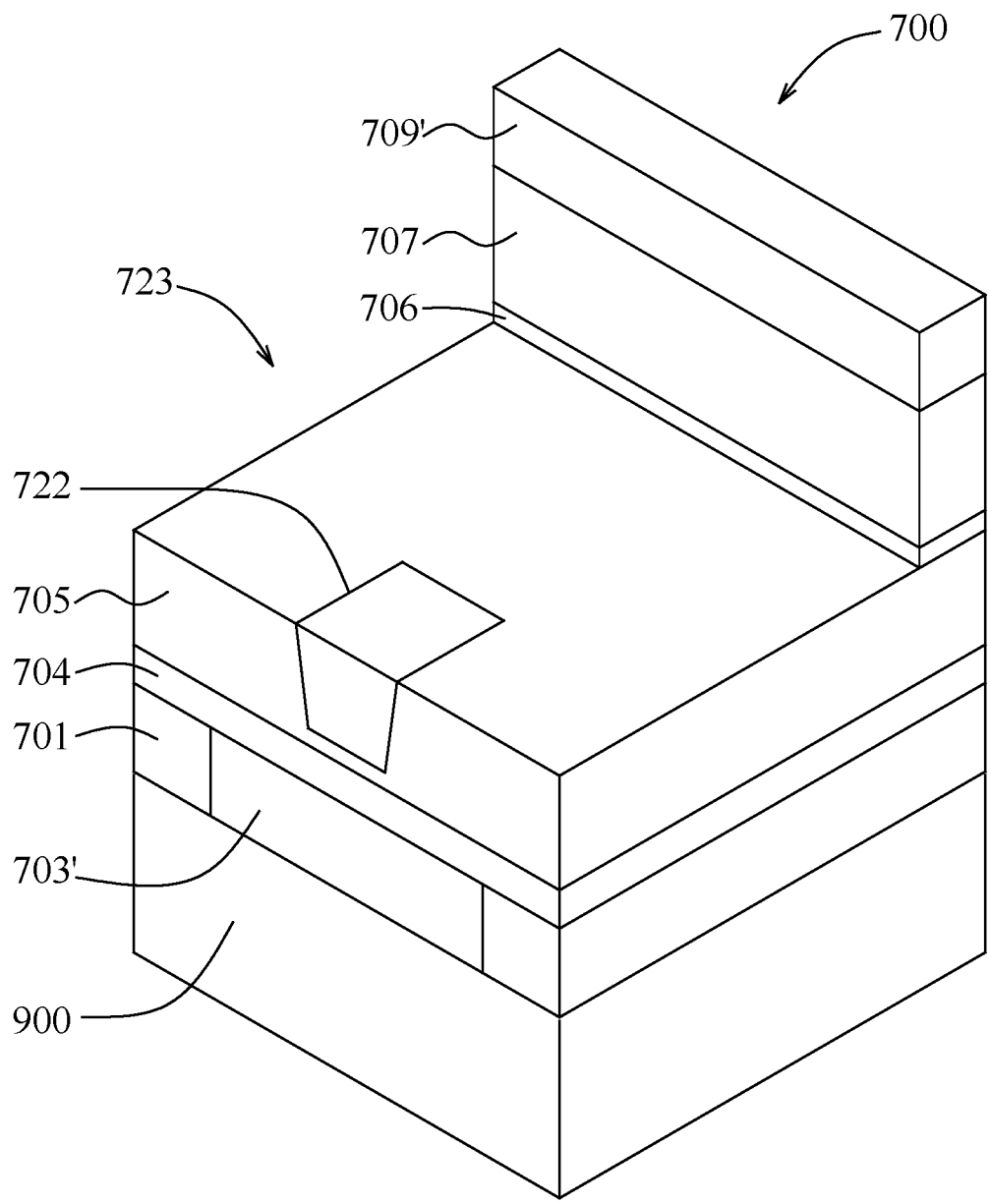

Referring to FIGS. 3, 10 and 11, the method 600 then proceeds to block 605, where the third dielectric layer 707 and the second etch stop layer 706 are recessed to form a second trench 723 therein. The second trench 723 exposes the second dielectric layer 705, has a bottom boundary coplanar with the top surface of the second dielectric layer 705, and is in spatial communication with the first trench 722. Block 605 may be implemented as described below. Firstly, as shown in FIGS. 10 and 11, a photolithography process, which includes, for example, but not limited to, coating the second dielectric layer 705, the second etch stop layer 706 and the third dielectric layer 707 with a photoresist 709, soft-baking, exposing the photoresist 709 through a photomask (not shown), post-exposure baking, developing the photoresist 709, and hard-baking, may be used to form a patterned photoresist 709'. Secondly, the third dielectric layer 707 and the second etch stop layer 706 are etched through the patterned photoresist 709' using, for example, dry etching, wet etching, other suitable etching techniques, or a combination thereof, so as to form the second trench 723 in the third dielectric layer 707 and the second etch stop layer 706. A portion of the photoresist 709 may remain in the first trench 722 after the etching process. The patterned photoresist 709' and the portion of the photoresist 709 remaining in the first trench 722 may be removed after block 605.

Figure 12:
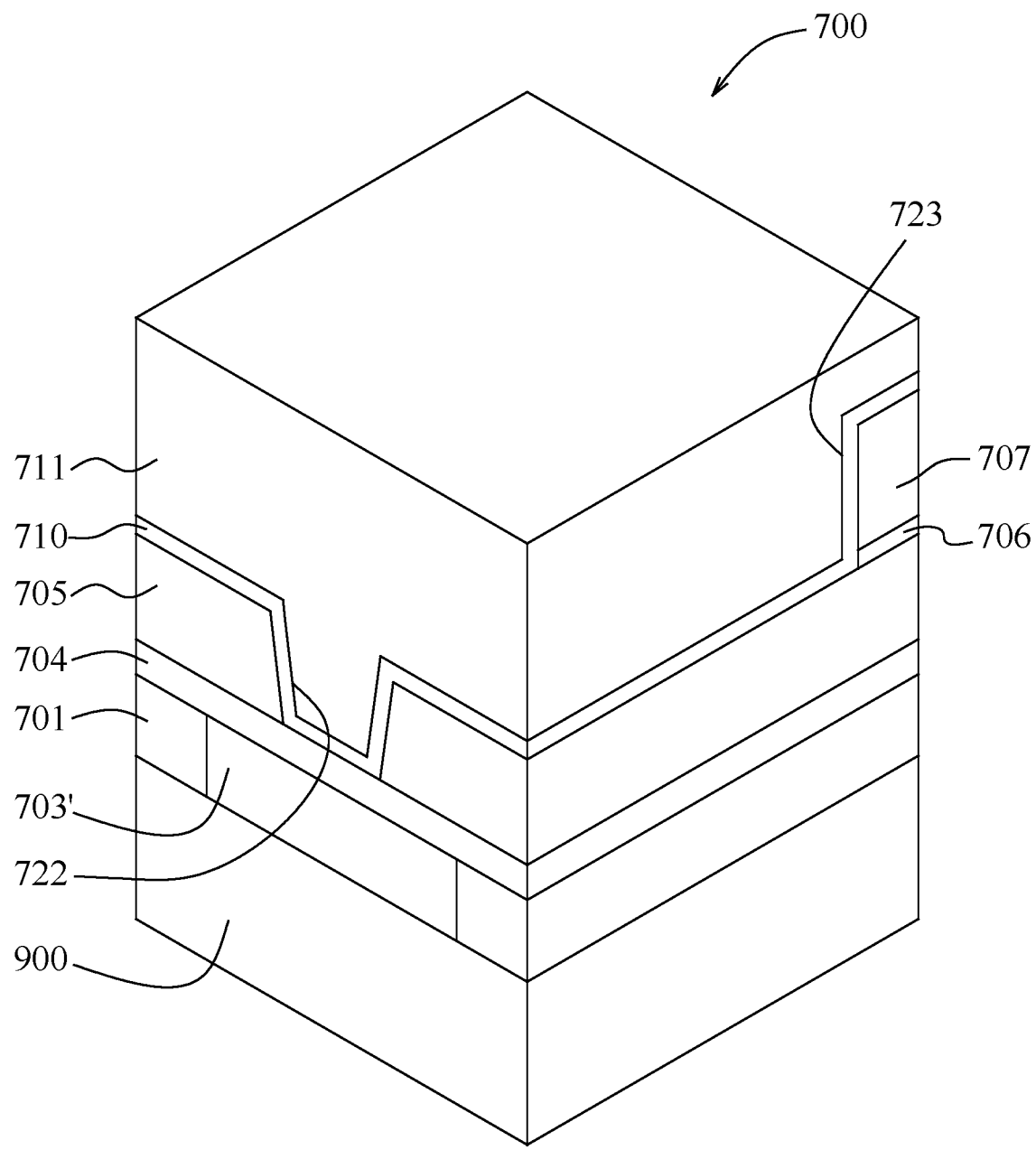

Referring to FIGS. 3 and 12, the method 600 then proceeds to block 606, where a barrier layer is conformally formed on a top surface of the third dielectric layer 707, inner surfaces of the second trench 723 and inner surfaces of the first trench 722. In some embodiments, as shown in FIG. 12, the barrier layer would chemically react with the second dielectric layer 705 and the third dielectric layer 707 to form a resistance changing layer 710. In alternative embodiments, the barrier layer would chemically react with only the second dielectric layer 705 to form the resistance changing layer 710. In some embodiments, the barrier layer may be conformally formed on the top surface of the third dielectric layer 707, the inner surfaces of the second trench 723 and the inner surfaces of the first trench 722 using, for example, physical vapor deposition, chemical vapor deposition, atomic layer deposition, electroless plating, electroplating, other suitable deposition techniques, or combinations thereof. In some embodiments, the barrier layer may be made of a conductive material containing metal atoms. The conductive material may be, for example but not limited to, tungsten, tantalum, titanium, nickel, cobalt, hafnium, ruthenium, zirconium, zinc, iron, tin, aluminum, copper, silver, molybdenum, chromium, compounds thereof (for example but not limited to nitride thereof), or combinations thereof. Other suitable materials for the barrier layer are within the contemplated scope of the present disclosure. In some embodiments, the resistance changing layer 710 may include a material containing metal atoms and oxygen atoms (for example but not limited to metal oxide, metal oxycarbide, metal oxynitride, metal oxycarbonitride, or combinations thereof). In some embodiments, an atomic percent of the oxygen atoms in the resistance changing layer 710 may fall within a range of from about 10% to about 90%. In some embodiments, a sum of a thickness of the resistance changing layer 710 and a thickness of the first etch stop layer 704 may fall within a range of from about 1 nm to about 15 nm.

Figure 13:
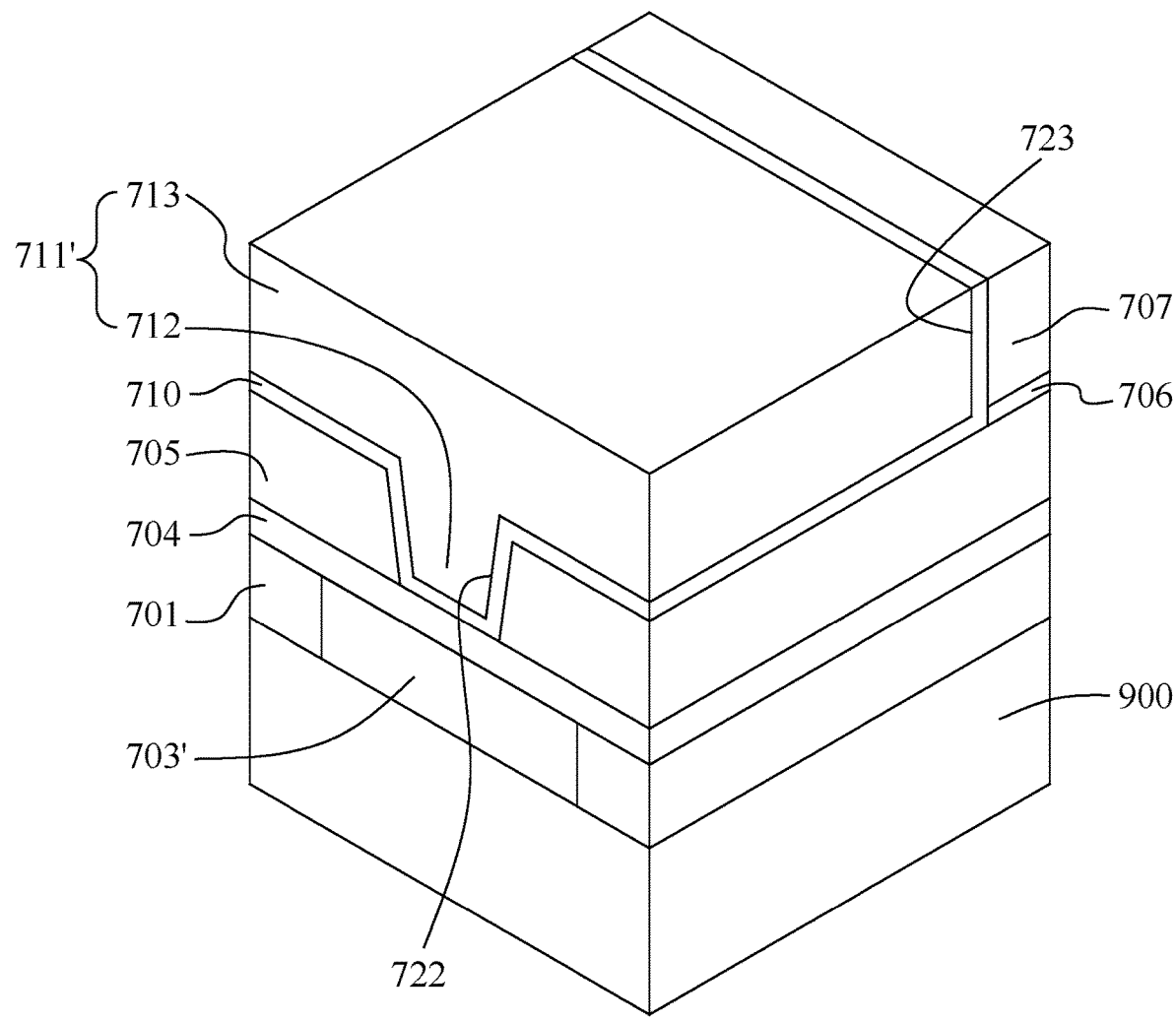

Referring to FIGS. 3, 12 and 13, the method 600 then proceeds to block 607, where a top electrode 711' is formed on the resistance changing layer 710 and fills the first trench 722 and the second trench 723. Block 607 may be implemented by (i) depositing a conductive material 711 on the resistance changing layer 710, and (ii) removing excess portions of the conductive material 711 and the resistance changing layer 710 to expose the third dielectric layer 707. The remaining portion of the conductive material 711 is referred to as the top electrode 711' that would serve as the top electrode 12 of the memory cell 100 shown in FIG. 1. The deposition of the conductive material 711 for forming the top electrode 711' may be implemented using, for example, physical vapor deposition, chemical vapor deposition, atomic layer deposition, electroless plating, electroplating, other suitable deposition techniques, or combinations thereof. The removal of the excess portions of the conductive material 711 and the resistance changing layer 710 may be implemented using, for example, chemical mechanical planarization, or other suitable planarization techniques. The top electrode 711' includes a first portion 712 that fills the first trench 722, and a second portion 713 that fills the second trench 723 and that covers the first portion 712. The first portion 712 would serve as the downward protrusion 121 of the top electrode 12 of the memory cell 100 shown in FIG. 1. A portion of the resistance changing layer 710 that covers side and bottom surfaces of the first portion 712 would serve as the resistive changing element 13 of the memory cell 100 shown in FIG. 1. In some embodiments, the top electrode 711' may be made of copper, aluminum, tungsten, tantalum, titanium, compounds thereof, other suitable conductive materials, or combinations thereof. Other suitable materials for the top electrode 711' are within the contemplated scope of the present disclosure. The bottom electrode 703' and the top electrode 711' may be made of the same or different materials.

In some embodiments, the method 600 may be fully compatible with a complementary metal oxide semiconductor (CMOS) logic process for fabricating planar field effect transistors (planar FETs) or fin field effect transistors (FinFETs), without extra process steps. The CMOS logic process is, for example, but not limited to, a 16 nanometer (N16) generation CMOS logic process, a 7 nanometer (N7) generation CMOS logic process, a 5 nanometer (N5) generation CMOS logic process, or other generation CMOS logic processes. In some embodiments, the bottom electrode 703' may be formed using an $n^{th}$ metal layer of the CMOS logic process, the first portion 712 of the top electrode 711' may be formed using an $n^{th}$ via layer of the CMOS logic process, and the second portion 713 of the top electrode 711' may be formed using an $(n+1)^{th}$ metal layer of the CMOS logic process, where n is a positive integer, so the semiconductor device 700 is fabricated in the back-end-of-line (BEOL), and multiple semiconductor devices 700 can be stacked to form a three-dimensional resistive memory device for use in high density applications. In some embodiments, an area of a top cross section of the first trench 722 for accommodating the first portion 712 of the top electrode 711' may be smaller than an area of a top cross section of a trench for accommodating a contact via of the CMOS logic process, so that the first trench 722 for accommodating the first portion 712 of the top electrode 711' and the trench for accommodating the contact via of the CMOS logic process can be simultaneously formed, and the first trench 722 for accommodating the first portion 712 of the top electrode 711' has a depth smaller than a depth of the trench for accommodating the contact via of the CMOS logic process, and does not expose the first etch stop layer 704.

Figure 14:
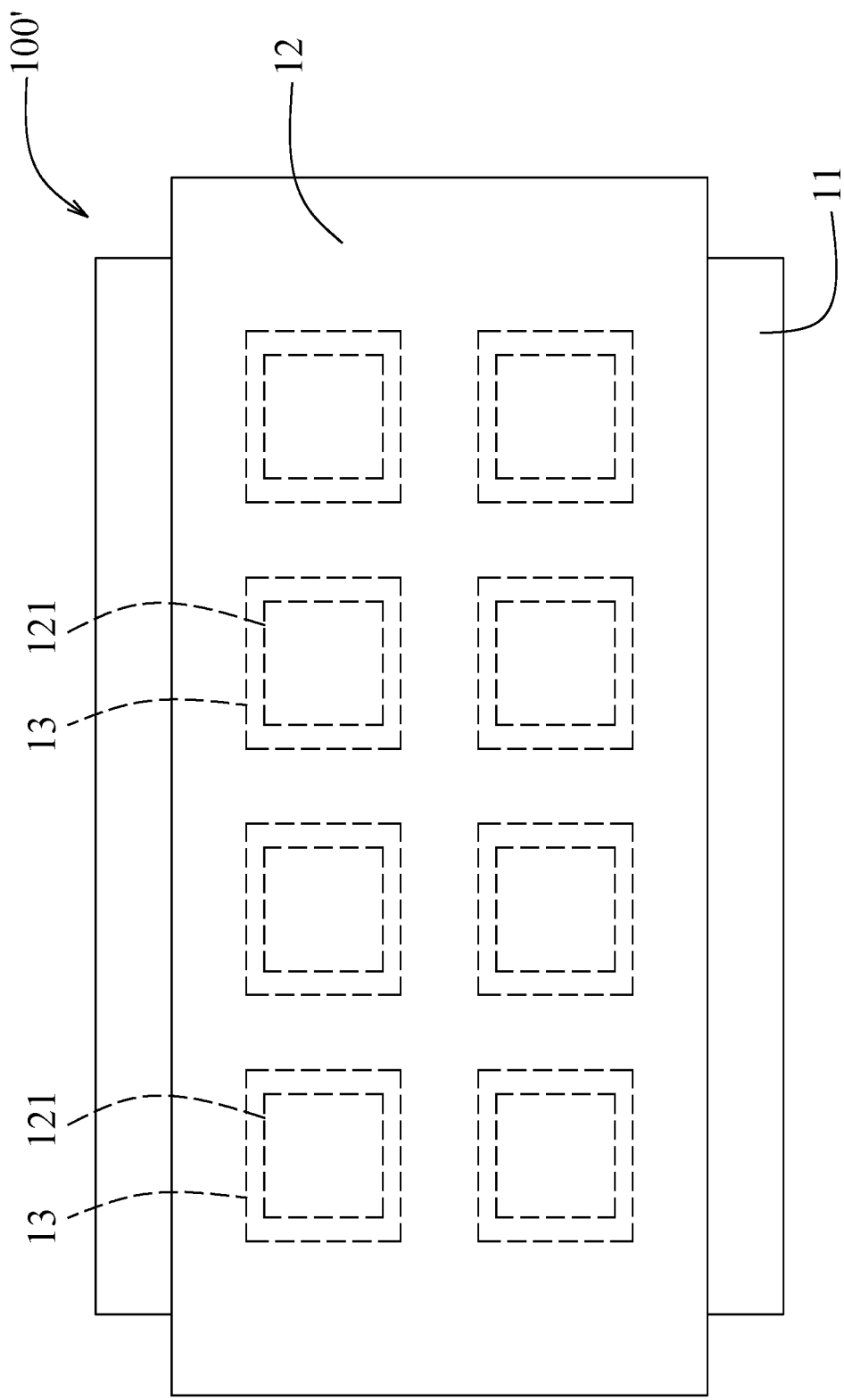
FIG. 14 is a schematic top view of a memory cell of a resistive memory device in accordance with some embodiments.

FIG. 14 is a schematic top view of a memory cell 100' of a resistive memory device in accordance with some embodiments. The memory cell 100' is formed by connecting multiple memory cells 100 shown in FIG. 1 in parallel, and includes a bottom electrode 11, a top electrode 12 and multiple resistance changing elements 13. The top electrode 12 is disposed above and spaced apart from the bottom electrode 11, and has multiple downward protrusions 121 that are aligned with the bottom electrode 11. Each of the resistance changing elements 13 covers side and bottom surfaces of a respective one of the downward protrusions 121. Each of the resistance changing elements 13 provides a storage node between the top electrode 12 and the bottom electrode 11, and the storage nodes respectively provided by the resistance changing elements 13 are connected in parallel, so the memory cell 100' can store one bit of data, and fabrication of the memory cell 100' can have a relatively high yield.

Figure 15:
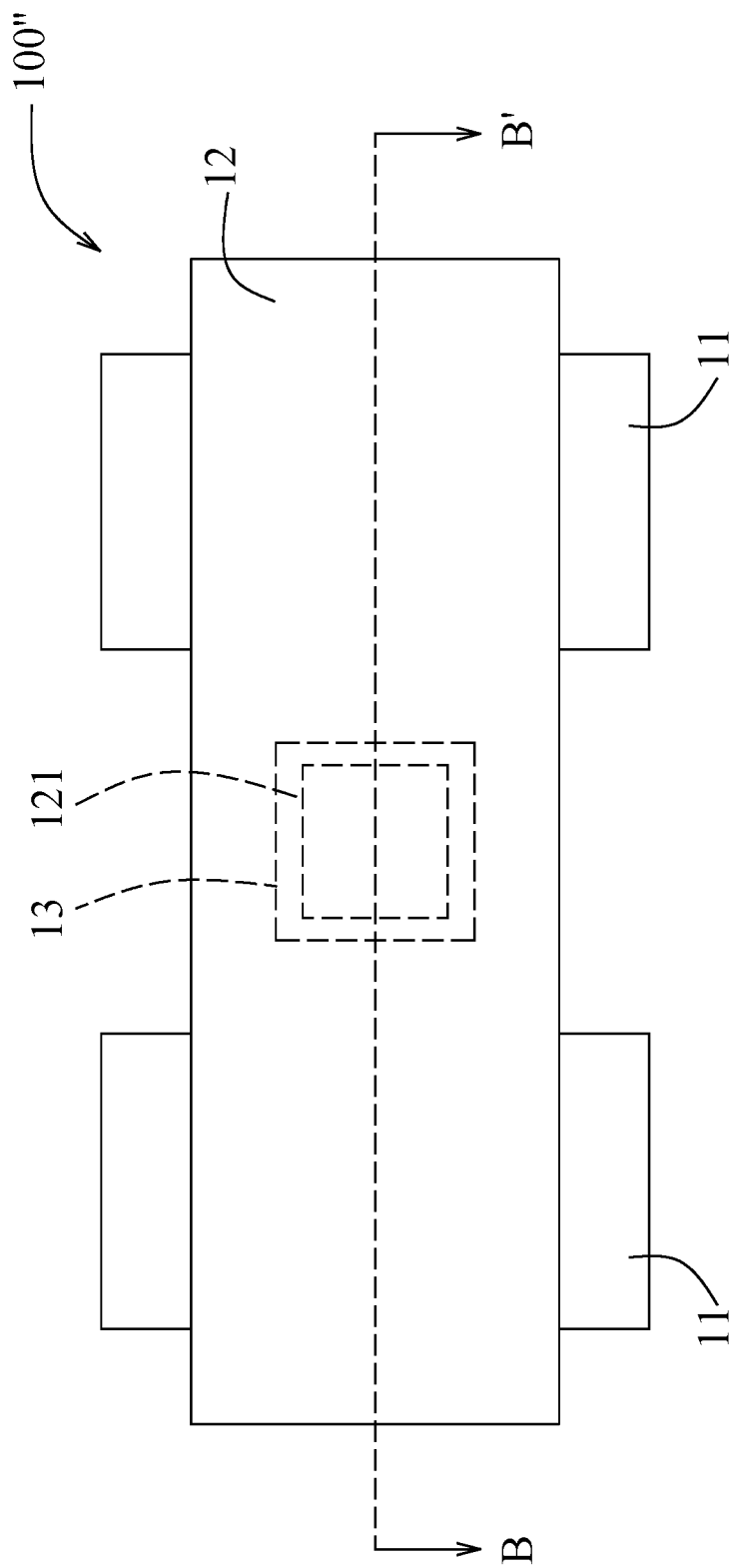
FIG. 15 is a schematic top view of a memory cell of a resistive memory device in accordance with some embodiments.
Figure 16:
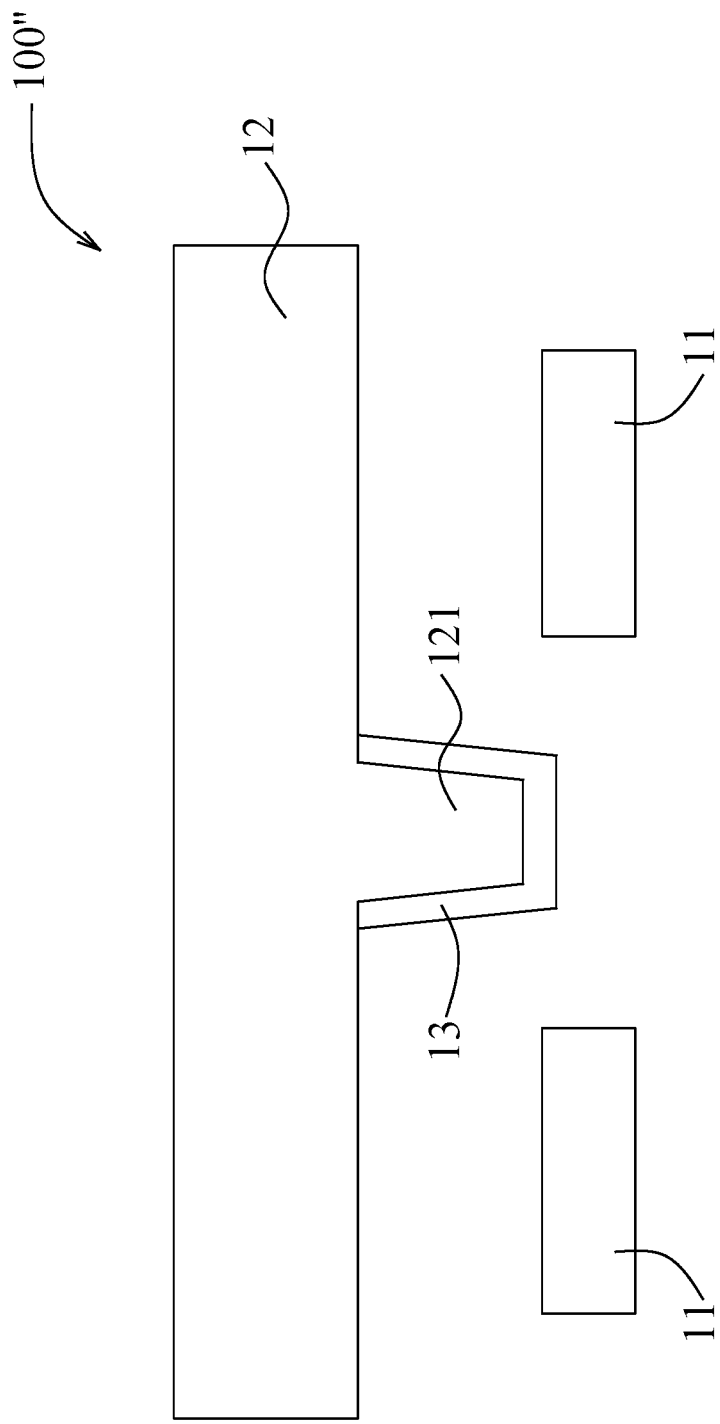
FIG. 16 is a schematic sectional view of the memory cell taken along line B-B' of FIG. 16 in accordance with some embodiments.

FIG. 15 is a schematic top view of a memory cell 100" of a resistive memory device in accordance with some embodiments. FIG. 16 is a schematic sectional view of the memory cell 100" taken along line B-B' of FIG. 15 in accordance with some embodiments. The memory cell 100" includes two bottom electrodes 11, a top electrode 12 and a resistance changing element 13. The bottom electrodes 11 are coplanar, and are spaced apart from each other. The top electrode 12 is disposed above and spaced apart from the bottom electrodes 11, and has a downward protrusion 121 that is aligned with a region between the bottom electrodes 11. The resistance changing element 13 covers side and bottom surfaces of the downward protrusion 121. The resistance changing element 13 provides two storage nodes, each of which is between the top electrode 12 and a respective one of the bottom electrodes 11, so the memory cell 100" can store two bits of data.

In some embodiments, the downward protrusion 121 may taper from top to bottom. In some embodiments, a top cross section of the downward protrusion 121 may be a rectangle that has a predetermined aspect ratio falling within a range of from about 1:10 to about 10:1. If the predetermined aspect ratio is outside this range, the top cross section of the downward protrusion 121 would have a very large area, which is adverse to miniaturization of the memory cell 100". In some embodiments, each side length of a bottom cross section of the downward protrusion 121 may be smaller than a corresponding side length of the top cross section of the downward protrusion 121 by a predetermined scaling factor that falls within a range of from about 5% to about 50% each side length of the bottom cross section of the downward protrusion 121 may be about 95% to 50% of the corresponding side length of the top cross section of the downward protrusion 121). If the predetermined scaling factor is smaller than 5%, it would be very difficult to manufacture the memory cell 100". If the predetermined scaling factor is greater than 50%, the bottom cross section of the downward protrusion 121 would have a very small area, and the memory cell 100" would be unable to operate properly.

In some embodiments, a projection of a top cross section of the downward protrusion 121 on a plane on which the bottom electrodes 11 are located may be non-overlapping with the bottom electrodes 11. In some embodiments, a distance between the projection and each of the bottom electrodes 11 may fall within a range sufficient to make the memory cell 100" have a good resistance changing effect and to make it possible to write data to and read data from the memory cell 100" at low or medium voltages. In some embodiments, the distance may be greater than about 10 nm, and may, for example but not limited to, fall within a range of from about 12 nm to about 16 nm.

In some embodiments, the resistance changing element 13 may be made of a material containing metal atoms and oxygen atoms (for example but not limited to metal oxide, metal oxycarbide, metal oxynitride, metal oxycarbonitride, or combinations thereof). In some embodiments, an atomic percent of the oxygen atoms in the resistance changing element 13 may fall within a range of from about 10% to about 90%. If the atomic percent is smaller than 10%, the resistance changing element 13 would not have a high resistance state, and the memory cell 100" would not have a resistance changing effect. It would be difficult to make the atomic percent greater than 90% if the resistance changing element 13 is generated by chemical reaction.

Figure 17:
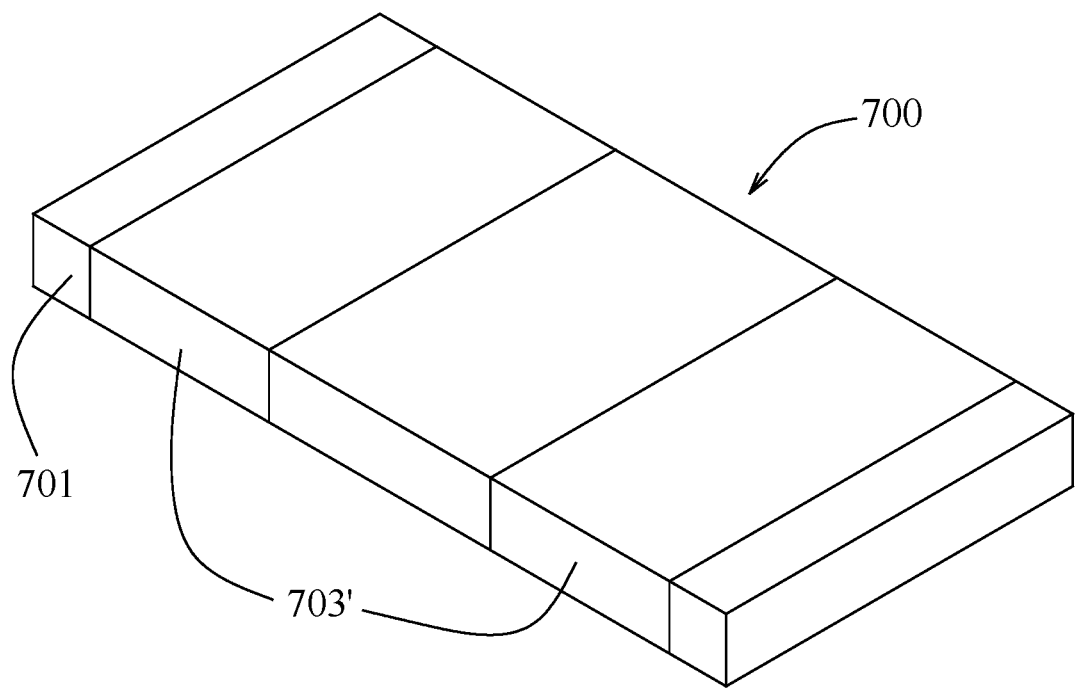
FIGS. 17 to 20 illustrate intermediate stages of a method for manufacturing a memory cell of a resistive memory device in accordance with some embodiments.
Figure 18:
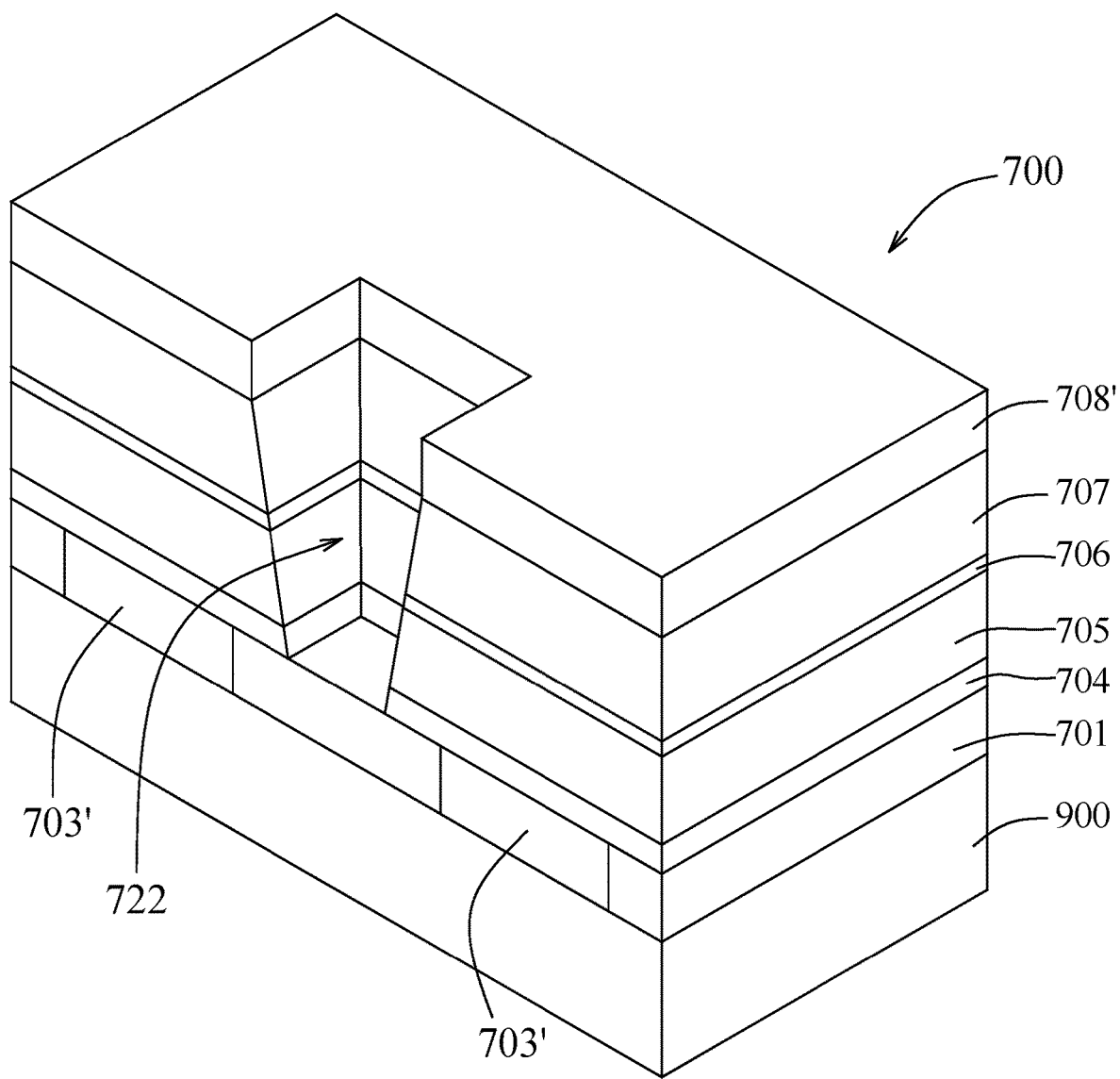
Figure 19:
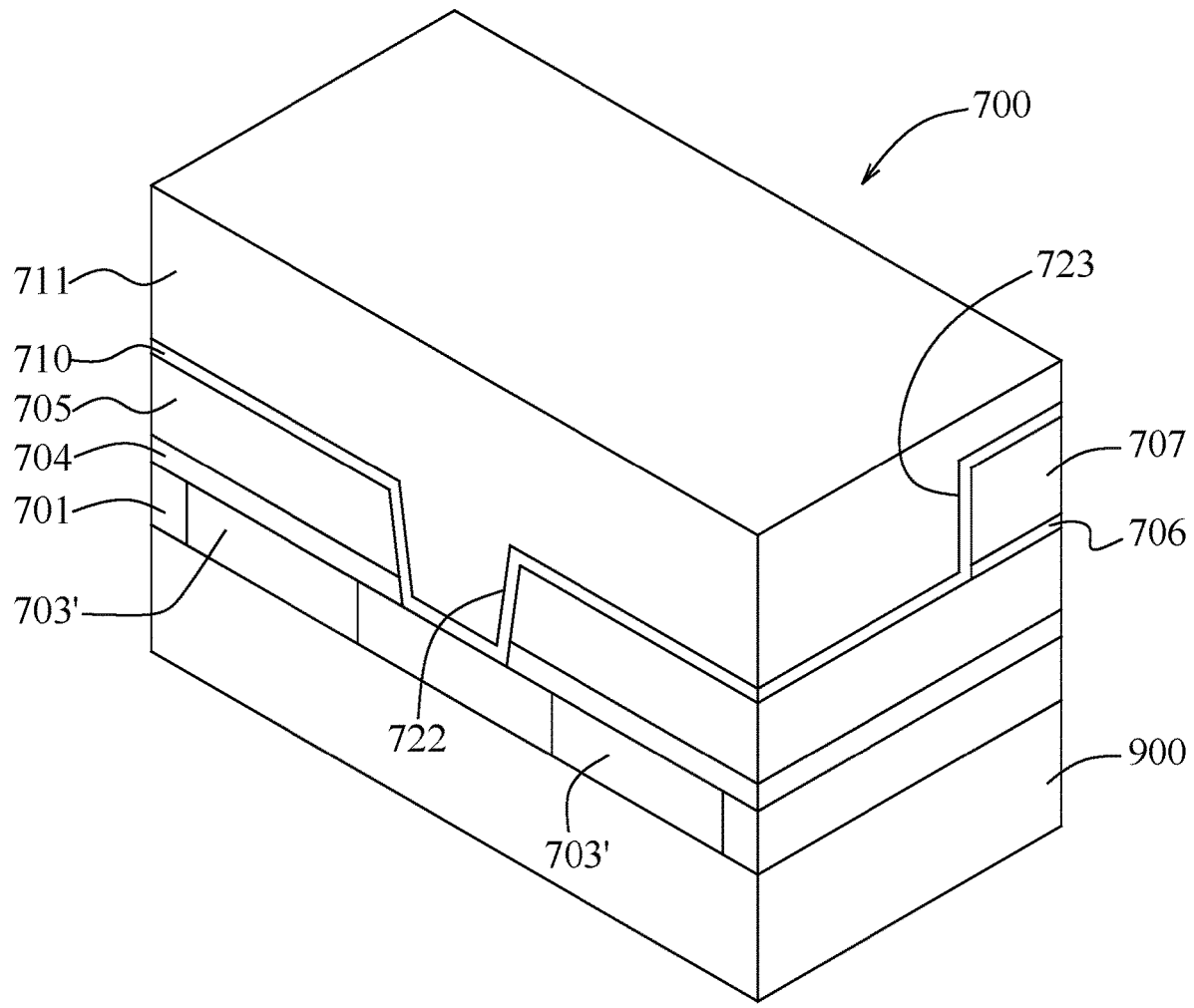
Figure 20:
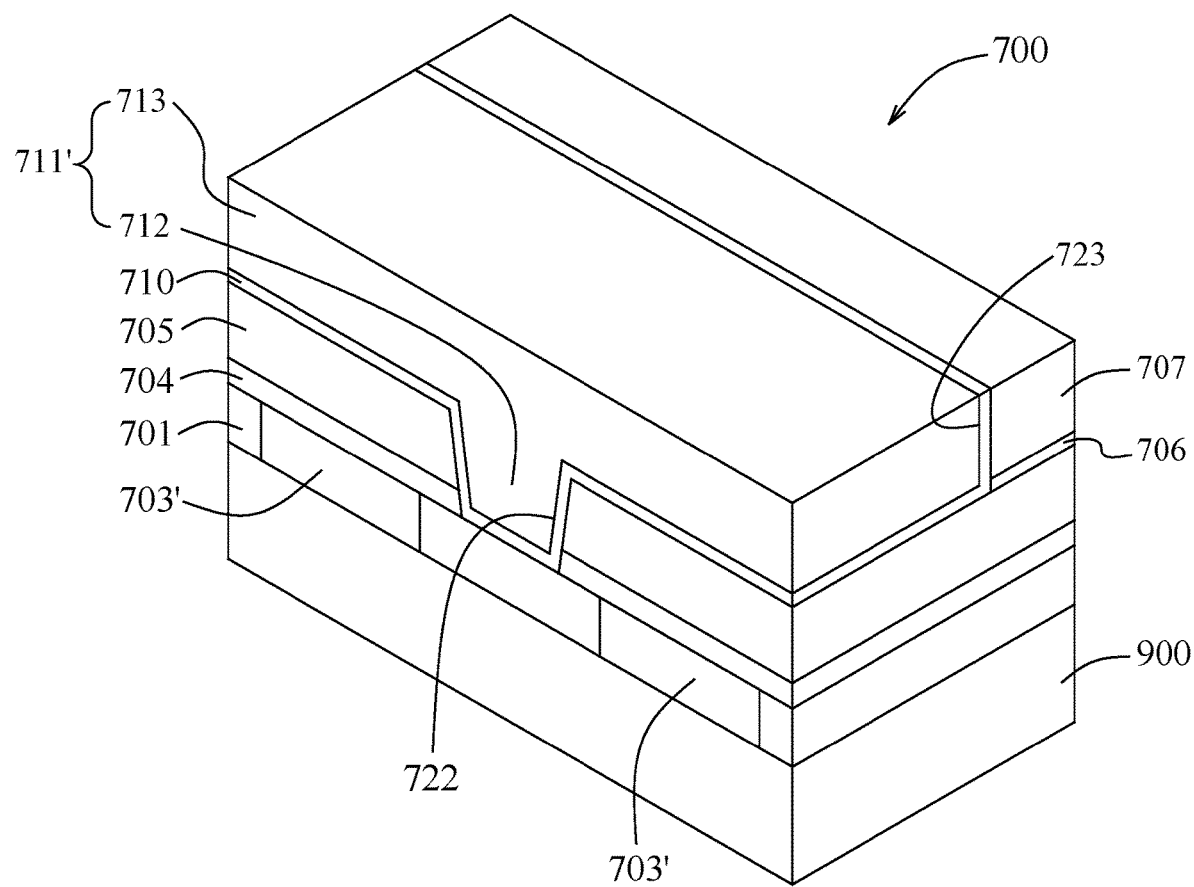

Referring to FIGS. 3 and 17 to 20, the memory cell 100" shown in FIG. 15 may be manufactured by a method which is similar to the method 600, and which differs from the method 600 in that: (a) in block 602, two bottom electrodes 703' are formed in the first dielectric layer 701 as shown in FIG. 17, and would respectively serve as the bottom electrodes 11 of the memory cell 100"; (b) in block 604, the first trench 722 is aligned with a region between the bottom electrodes 703', is formed in the second dielectric layer 705 and the first etch stop layer 704, and exposes the first dielectric layer 701 as shown in FIG. 18; and (c) in block 606, the barrier layer 723 would further chemically react with the first dielectric layer 701 to form the resistance changing layer 710 as shown in FIG. 19. The semiconductor structure 700 after block 607 is depicted in FIG. 20.

In some embodiments, other than the second dielectric layer 705, the first dielectric layer 701 may also be made of a dielectric material containing oxygen atoms (for example, but not limited to, silicon oxide, silicon oxycarbide, silicon oxynitride, silicon oxycarbonitride, undoped silicate glass, phosphosilicate glass, borosilicate glass, boron-doped phosphosilicate glass, fluorine-doped silicate glass, or combinations thereof). In some embodiments, a projection of a top cross section of the first trench 722 on the first dielectric layer 701 may be non-overlapping with the bottom electrodes 703'.

In some embodiments, the area of the top cross section of the first trench 722 for accommodating the first portion 712 of the top electrode 711' may be equal to the area of the top cross section of the trench for accommodating the contact via of the CMOS logic process, so that the first trench 722 for accommodating the first portion 712 of the top electrode 711' and the trench for accommodating the contact via of the CMOS logic process can be simultaneously formed, and the first trench 722 for accommodating the first portion 712 of the top electrode 711' has a depth substantially equal to a depth of the trench for accommodating the contact via of the CMOS logic process, and exposes the first dielectric layer 701.

Figure 21:
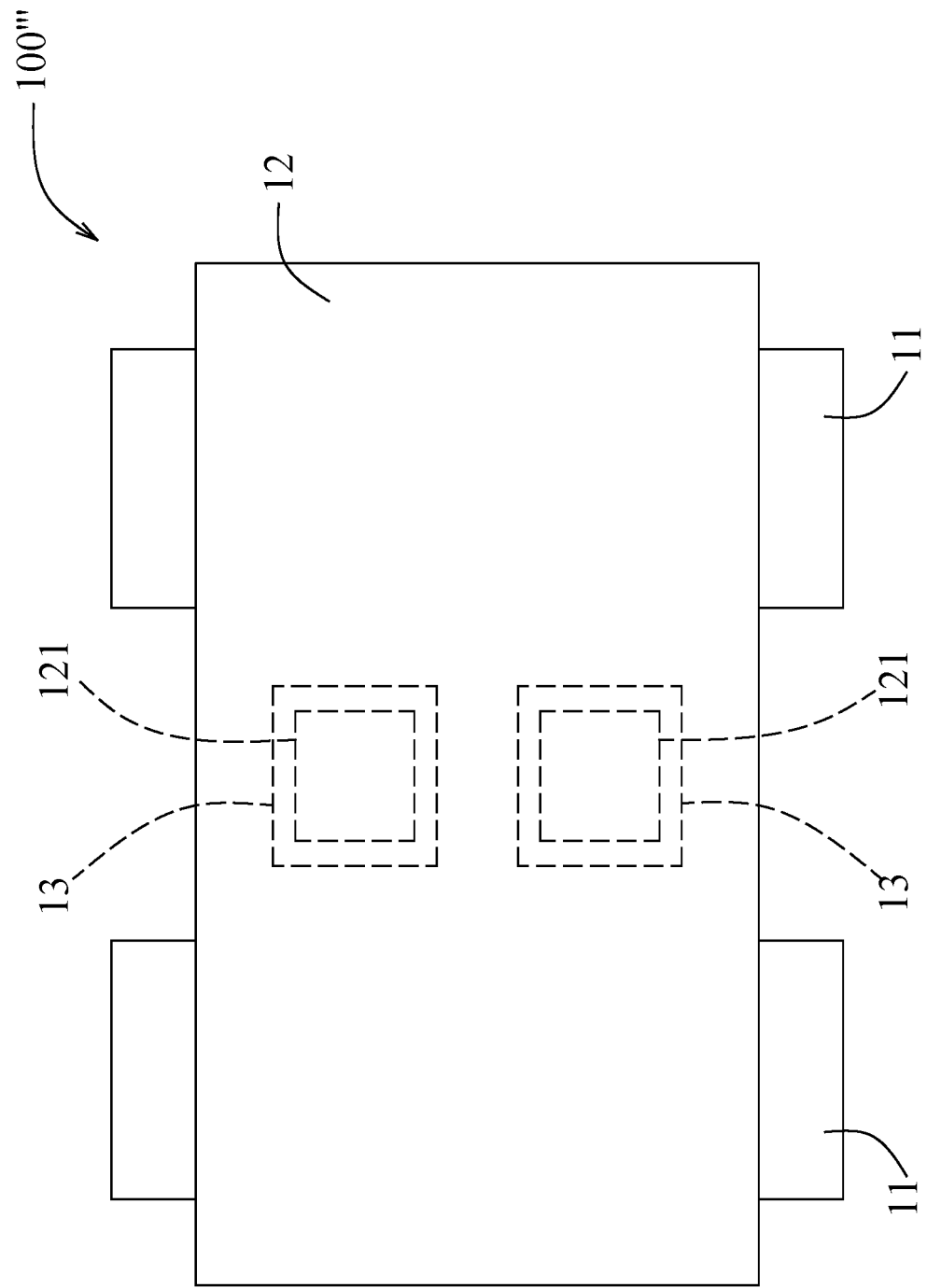
FIG. 21 is a schematic top view of a memory cell of a resistive memory device in accordance with some embodiments.

FIG. 21 is a schematic top view of a memory cell 100''' of a resistive memory device in accordance with some embodiments. The memory cell 100''' is formed by connecting multiple memory cells 100 shown in FIG. 1 in parallel, and includes two bottom electrodes 11, a top electrode 12 and multiple resistance changing elements 13. The top electrode 12 is disposed above and spaced apart from the bottom electrodes 11, and has multiple downward protrusions 121 that are aligned with a region between the bottom electrodes 11. Each of the resistance changing elements 13 covers side and bottom surfaces of a respective one of the downward protrusions 121. Each of the resistance changing elements 13 provides two storage nodes, each of which is between the top electrode 12 and the respective one of the bottom electrodes 11, the storage nodes respectively provided by the resistance changing elements 13 between the top electrode 12 and one of the bottom electrodes 11 are connected in parallel, and the storage nodes respectively provided by the resistance changing elements 13 between the top electrode 12 and the other one of the bottom electrodes 11 are connected in parallel, so the memory cell 100''' can store two bits of data, and fabrication of the memory cell 100''' can have a relatively high yield.

In accordance with some embodiments of the present disclosure, a resistive memory device includes a bottom electrode, a top electrode and a resistance changing element. The top electrode is disposed above and spaced apart from the bottom electrode, and has a downward protrusion aligned with the bottom electrode. The resistance changing element covers side and bottom surfaces of the downward protrusion.

In accordance with some embodiments of the present disclosure, the downward protrusion tapers from top to bottom.

In accordance with some embodiments of the present disclosure, a top cross section of the downward protrusion is a rectangle.

In accordance with some embodiments of the present disclosure, the top electrode has a plurality of the downward protrusions, the resistive memory device includes a plurality of the resistance changing elements, and each of the resistance changing elements covers the side and bottom surfaces of a respective one of the downward protrusions.

In accordance with some embodiments of the present disclosure, the resistance changing element provides a storage node between the top electrode and the bottom electrode.

In accordance with some embodiments of the present disclosure, a resistive memory device includes two bottom electrodes, a top electrode and a resistance changing element. The bottom electrodes are coplanar with and spaced apart from each other. The top electrode is disposed above and spaced apart from the bottom electrodes, and has a downward protrusion aligned with a region between the bottom electrodes. The resistance changing element covers side and bottom surfaces of the downward protrusion.

In accordance with some embodiments of the present disclosure, a projection of a top cross section of the downward protrusion on a plane on which the bottom electrodes are located does not overlap the bottom electrodes.

In accordance with some embodiments of the present disclosure, the downward protrusion tapers from top to bottom.

In accordance with some embodiments of the present disclosure, a top cross section of the downward protrusion is a rectangle.

In accordance with some embodiments of the present disclosure, the top electrode has a plurality of the downward protrusions, the resistive memory device includes a plurality of the resistance changing elements, and each of the resistance changing elements covers the side and bottom surfaces of a respective one of the downward protrusions.

In accordance with some embodiments of the present disclosure, the resistance changing element provides two storage nodes, each of which is between the top electrode and a respective one of the bottom electrodes.

In accordance with some embodiments of the present disclosure, a method for manufacturing a resistive memory device includes: forming at least one bottom electrode in a first dielectric layer; forming a second dielectric layer and a third dielectric layer on the first dielectric layer and the at least one bottom electrode; recessing the third dielectric layer and the second dielectric layer to form a first trench in the second dielectric layer; recessing the third dielectric layer to form a second trench in the third dielectric layer, the second trench being in spatial communication with the first trench; forming a barrier layer on inner surfaces of the second trench and inner surfaces of the first trench, the barrier layer chemically reacting with at least the second dielectric layer to form a resistance changing layer; and forming a top electrode on the resistance changing layer, the top electrode filling the first trench and the second trench.

In accordance with some embodiments of the present disclosure, a bottom electrode is formed in the first dielectric layer, and the first trench is aligned with the bottom electrode, has a top boundary coplanar with a top surface of the second dielectric layer, and has a depth smaller than a thickness of the second dielectric layer.

In accordance with some embodiments of the present disclosure, the second dielectric layer is made of a dielectric material containing oxygen atoms, and the barrier layer is made of a conductive material containing metal atoms.

In accordance with some embodiments of the present disclosure, two bottom electrodes are formed in the first dielectric layer, the first trench is aligned with a region between the bottom electrodes, and exposes the first dielectric layer, and the barrier layer further chemically reacts with the first dielectric layer to form the resistance changing layer.

In accordance with some embodiments of the present disclosure, each of the first dielectric layer and the second dielectric layer is made of a dielectric material containing oxygen atoms, and the barrier layer is made of a conductive material containing metal atoms.

In accordance with some embodiments of the present disclosure, a projection of a top cross section of the first trench on the first dielectric layer does not overlap the bottom electrodes.

In accordance with some embodiments of the present disclosure, the first trench tapers from top to bottom.

In accordance with some embodiments of the present disclosure, a top cross section of the first trench is a rectangle.

In accordance with some embodiments of the present disclosure, the resistance changing layer includes a material containing metal atoms and oxygen atoms, and an atomic percent of the oxygen atoms in the resistance changing layer falls within a range of from 10% to 90%.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive memory device comprising:
   a bottom electrode;
   a top electrode disposed above and spaced apart from the bottom electrode, and having a downward protrusion aligned with the bottom electrode; and
   a resistance changing element covering side and bottom surfaces of the downward protrusion.

2. The resistive memory device according to claim 1, wherein the downward protrusion tapers from top to bottom.

3. The resistive memory device according to claim 1, wherein a top cross section of the downward protrusion is a rectangle.

4. The resistive memory device according to claim 1, wherein:
   the top electrode has a plurality of the downward protrusions;
   the resistive memory device comprises a plurality of the resistance changing elements; and
   each of the resistance changing elements covers the side and bottom surfaces of a respective one of the downward protrusions.

5. The resistive memory device according to claim 1, wherein the resistance changing element provides a storage node between the top electrode and the bottom electrode.

6. The resistive memory device according to claim 1, wherein:
   the resistance changing element includes a material containing metal atoms and oxygen atoms; and
   an atomic percent of the oxygen atoms in the resistance changing element falls within a range of from 10% to 90%.

7. The resistive memory device according to claim 1, wherein a distance between the downward protrusion and the bottom electrode falls within a range of from 1 nm to 15 nm.

8. The resistive memory device according to claim 3, wherein each side length of a bottom cross section of the downward protrusion is smaller than a corresponding side length of the top cross section of the downward protrusion by a predetermined scaling factor that falls within a range of from 5% to 50%.

9. A resistive memory device comprising:
   at least one bottom electrode;
   a top electrode disposed above and spaced apart from the at least one bottom electrode, and having a downward protrusion; and
   a resistance changing element covering side and bottom surfaces of the downward protrusion.

10. The resistive memory device according to claim 9, wherein the downward protrusion tapers from top to bottom.

11. The resistive memory device according to claim 9, wherein a top cross section of the downward protrusion is a rectangle.

12. The resistive memory device according to claim 11, wherein each side length of a bottom cross section of the downward protrusion is smaller than a corresponding side length of the top cross section of the downward protrusion by a predetermined scaling factor that falls within a range of from 5% to 50%.

13. The resistive memory device according to claim 9, wherein the resistance changing element provides at least one storage node between the top electrode and the at least one bottom electrode.

14. The resistive memory device according to claim 9, wherein:
   the resistance changing element includes a material containing metal atoms and oxygen atoms; and
   an atomic percent of the oxygen atoms in the resistance changing element falls within a range of from 10% to 90%.

15. A resistive memory device comprising:
   at least one bottom electrode;
   a top electrode disposed above and spaced apart from the at least one bottom electrode, and having a plurality of the downward protrusions; and
   a plurality of the resistance changing elements each covering side and bottom surfaces of a respective one of the downward protrusions.

16. The resistive memory device according to claim 15, wherein each of the downward protrusions tapers from top to bottom.

17. The resistive memory device according to claim 15, wherein a top cross section of each of the downward protrusions is a rectangle.

18. The resistive memory device according to claim 17, wherein, with respect to each of the downward protrusions, each side length of a bottom cross section of the downward protrusion is smaller than a corresponding side length of the top cross section of the downward protrusion by a predetermined scaling factor that falls within a range of from 5% to 50%.

19. The resistive memory device according to claim 15, wherein each of the resistance changing elements provides at least one storage node between the top electrode and the at least one bottom electrode.

20. The resistive memory device according to claim 15, wherein, with respect to each of the resistance changing elements:
   the resistance changing element includes a material containing metal atoms and oxygen atoms; and
   an atomic percent of the oxygen atoms in the resistance changing element falls within a range of from 10% to 90%.

* * * * *